(12) United States Patent
Saito

(10) Patent No.: US 10,627,838 B1
(45) Date of Patent: Apr. 21, 2020

(54) COMPARATOR WITH ADAPTIVE SENSE VOLTAGE CLAMP

(71) Applicant: TEXAS INSTRUMENTS INCORPORATED, Dallas, TX (US)

(72) Inventor: Mitsuyori Saito, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/258,233

(22) Filed: Jan. 25, 2019

Related U.S. Application Data

(60) Provisional application No. 62/786,993, filed on Dec. 31, 2018.

(51) Int. Cl.
| | |
|---|---|
| *H03K 5/22* | (2006.01) |
| *H03K 5/153* | (2006.01) |
| *G05F 1/46* | (2006.01) |
| *G05F 3/26* | (2006.01) |
| *G05F 1/595* | (2006.01) |
| *G05F 1/56* | (2006.01) |

(52) U.S. Cl.
CPC .............. *G05F 1/468* (2013.01); *G05F 1/562* (2013.01); *G05F 1/595* (2013.01); *G05F 3/262* (2013.01)

(58) Field of Classification Search
CPC .......... G05F 1/468; G05F 1/562; G05F 3/262; G05F 1/595
See application file for complete search history.

(56) References Cited

U.S. PATENT DOCUMENTS

| | | | |
|---|---|---|---|
| 6,693,466 B2 * | 2/2004 | Inoue ................. | H03K 3/02337 327/72 |
| 7,049,859 B2 * | 5/2006 | Boyer ..................... | F02P 7/077 327/73 |
| 7,109,761 B2 * | 9/2006 | Isomura ............ | H03K 3/02337 327/321 |
| 8,901,967 B2 * | 12/2014 | Nakajima ............ | H03K 5/2481 327/77 |

* cited by examiner

*Primary Examiner* — Kenneth B Wells
(74) *Attorney, Agent, or Firm* — Tuenlap Chan; Charles A. Brill; Frank D. Cimino

(57) ABSTRACT

A system includes a monitored component and a comparator configured to compare a sense voltage from the monitored component with a reference voltage. The system also includes an adaptive input clamping circuit configured to limit the sense voltage input to the comparator to below an upper threshold voltage.

19 Claims, 4 Drawing Sheets

COMPARATOR WITH ADAPTIVE SENSE VOLTAGE CLAMP

CROSS-REFERENCE TO RELATED APPLICATION

This application claims priority to U.S. Provisional Application No. 62/786,993 filed Dec. 31, 2018, titled "Comparator with Adaptive Sense Voltage Clamp" which is hereby incorporated herein by reference in its entirety.

BACKGROUND

Precise voltage monitoring (e.g., +/−1%) is needed in various electrical devices (e.g., safety devices). One example circuit used for voltage monitoring is a comparator. Over time, the threshold voltage of transistors used in a comparator may shift. For example, if the threshold voltage of transistors used in a comparator shift due to positive bias temperature instability (PBTI) or negative bias temperature instability (NBTI), the results is a loss of accuracy in the comparator over time.

SUMMARY

In accordance with at least some examples of the disclosure, a system comprises a monitored component and a comparator configured to compare a sense voltage from the monitored component with a reference voltage. The system also comprises an adaptive input clamping circuit configured to limit the sense voltage input to the comparator to below an upper threshold voltage.

In accordance with at least some examples of the disclosure, a device comprises a comparator circuit configured to compare a sense voltage with a reference voltage and to provide a comparison output. The comparator circuit comprises an input transistor pair that includes a reference voltage input node and sense voltage input node. The comparator circuit also comprises a current mirror transistor pair. The device also comprises an adaptive clamping circuit configured to limit the sense voltage input to the sense voltage input node below an upper threshold voltage.

In accordance with at least some examples of the disclosure, an integrated circuit comprises a comparator circuit having an input transistor pair that includes a sense voltage input node. The comparator circuit also comprises a current mirror transistor pair and cascaded transistors with current terminals in series between respective current terminals of the input transistor pairs and respective current terminals of the current mirror transistors. The integrated circuit also comprises an adaptive clamp circuit for the comparator circuit. The adaptive clamp circuit comprises a first transistor and a second transistor, each of the first and second transistors having a control terminal, a first current terminal, and a second current terminal. The control terminals of the first and second transistors are coupled to a common-mode voltage node for the comparator circuit.

BRIEF DESCRIPTION OF THE DRAWINGS

For a detailed description of various examples, reference will now be made to the accompanying drawings in which.

DETAILED DESCRIPTION

Disclosed herein are comparator circuit topologies that include an adaptive sense voltage clamp. In different examples, the disclosed comparator circuit topologies are part of a system, a device, or an integrated circuit, where a sense voltage (e.g., from a monitored component) is compared with a reference voltage. In some examples, the adaptive sense voltage clamp limits a sense voltage input to a comparator below an upper threshold voltage (i.e., the adaptive sense voltage clamp includes a high-level clamp). Additionally or alternatively, the adaptive sense voltage clamp limits the sense voltage input to the comparator above a lower threshold voltage (i.e., the adaptive sense voltage clamp includes a low-level clamp). With the adaptive sense voltage clamp, changes in the threshold voltage of transistors used in a comparator circuit (e.g., due to positive bias temperature instability (PBTI) or negative bias temperature instability (NBTI)) are accounted for such that comparator operations remain accurate over time.

In some examples, the sense voltage is clamped between VREF−2*VTN and VREF+2*VTP, where VREF is the reference voltage, VTN is the threshold voltage of an NMOS transistor, and VTP is the threshold voltage of a PMOS transistor. In some examples, an adaptive sense voltage clamp includes two different threshold voltage transistors (different Vt values) to make sure a sense voltage path is decoupled from the comparator circuit before clamping to reduce input current and minimize implementation. Also, in some examples, the clamping voltage is generated from VREF. To provide a better understanding, various comparator and adaptive sense voltage clamp options are described using the figures as follows.

Figure 1:
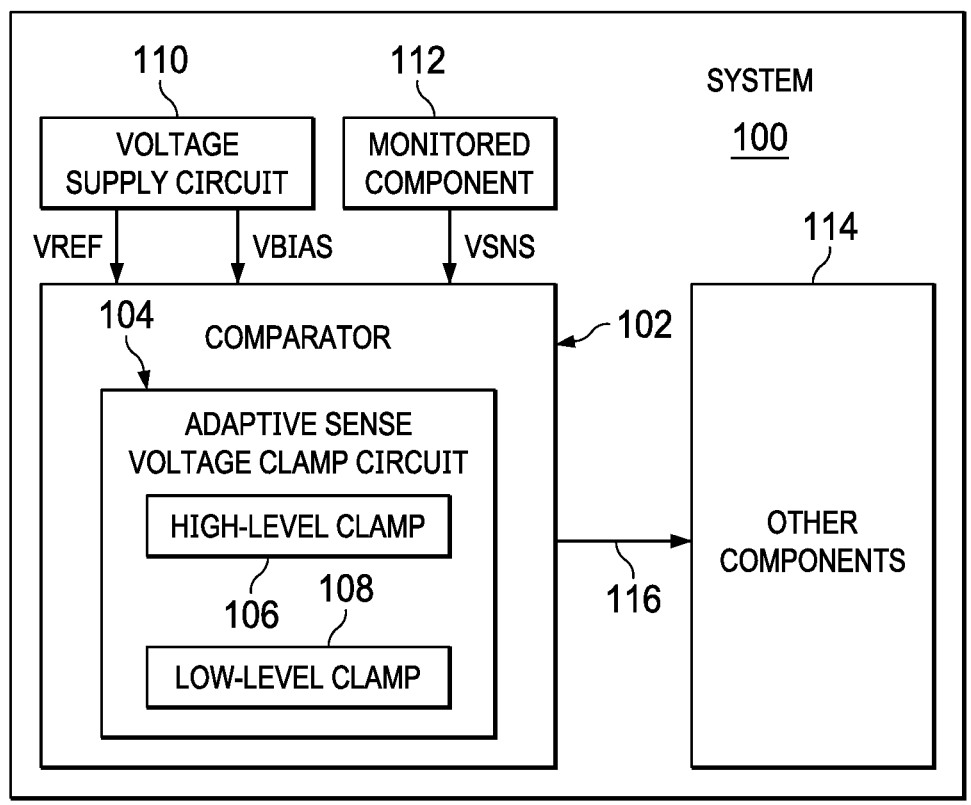
FIG. 1 is a block diagram showing a system in accordance with various examples.

FIG. 1 is a block diagram showing a system 100 in accordance with various examples. In FIG. 1, the system 100 is an example of a consumer product, an electrical device, or a semiconductor chip with integrated circuits. As shown, the system 100 includes a voltage supply circuit 110, a monitored component 112, and a comparator circuit 102 with an adaptive sense voltage clamp circuit 104, where the adaptive sense voltage clamp circuit 104 include a high-level clamp circuit 106 and/or a low-level clamp circuit 108. While the adaptive sense voltage clamp circuit 104 of FIG. 1 is represented as being part of the comparator circuit 102, it should be appreciated that the adaptive sense voltage clamp circuit 104 could be understood to be between the comparator circuit 104 and the monitored component 112. In either case, the adaptive sense voltage clamp circuit 104 regulates the sense voltage (VSNS) provide to a sense voltage input node of the comparator 102 (see e.g., FIG. 3), such that VSNS is limited to a predetermined range. In some examples, VSNS is limited or clamped between VREF−2*VTN and VREF+2*VTP, where VREF is a reference voltage provided by a voltage supply circuit 110, VTN is the threshold voltage of an NMOS transistor (e.g., part of the adaptive sense voltage clamp circuit 104), and VTP is the threshold voltage of a PMOS transistor (e.g., part of the adaptive sense voltage clamp circuit 104). As shown, the voltage supply circuit 110 also supplies a bias voltage (VBIAS) to the comparator circuit 102.

In the example of FIG. 1, the system 100 also includes other components 114. In one example, the other components 114 include power management components for the system 100, where the output of the comparator 116 is used for power regulation. In another example, the comparator 102 is used for over voltage detection of the monitored component 112, where a detected over voltage condition indicated by the output of the comparator 102 is used to disable the monitored component 112. In another example, the comparator 102 is used for under voltage detection of the monitored component 112, where a detected under voltage condition indicated by the output of the comparator 102 can be used as flag for another system or a system component.

Figure 2:
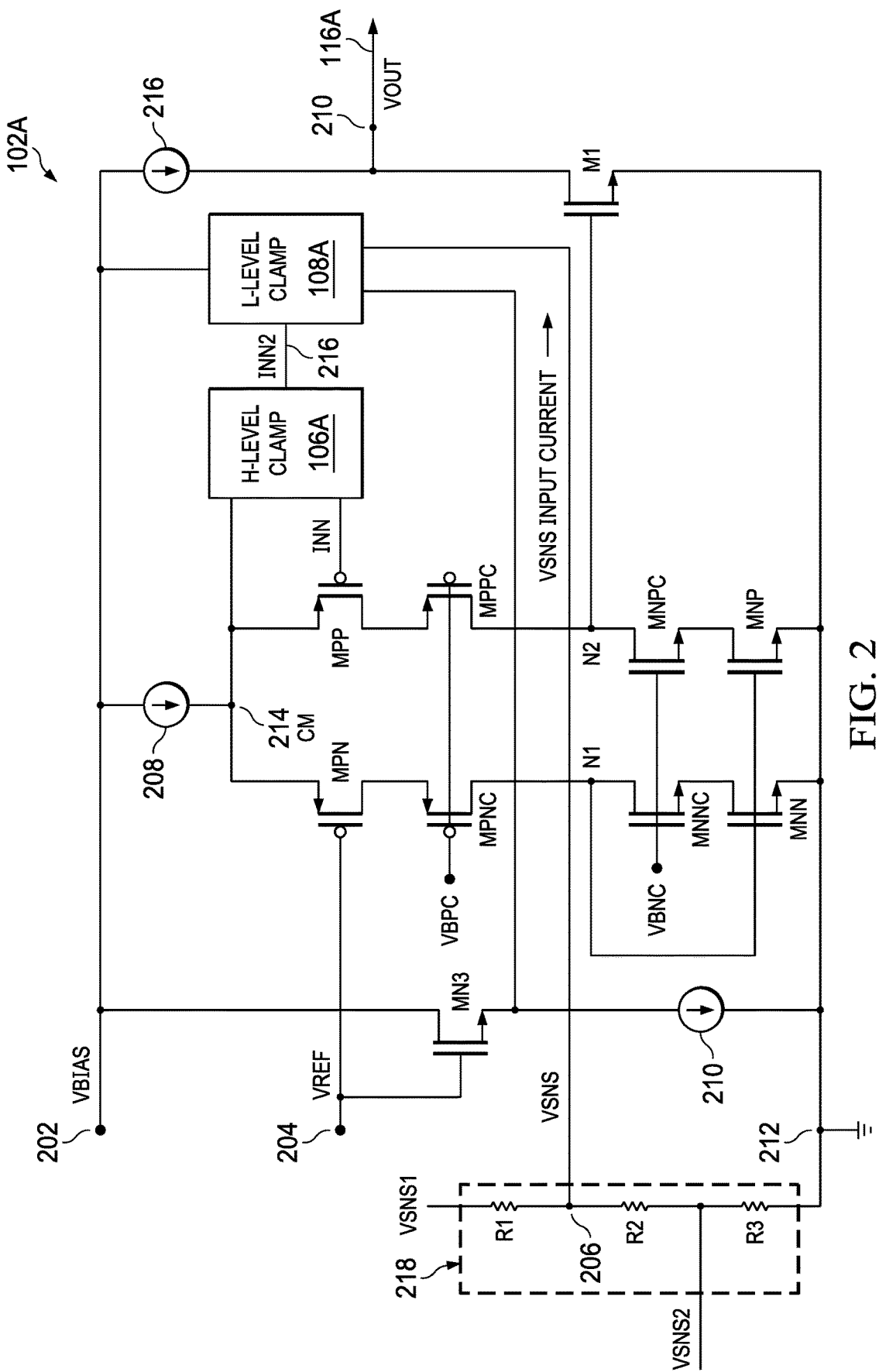
FIG. 2 is a schematic diagram showing a comparator circuit with adaptive sense voltage clamps in accordance with various examples.

FIG. 2 is a schematic diagram showing a comparator circuit 102A (an example of the comparator circuit 102 in FIG. 1) with adaptive sense voltage clamp circuits 106A and 108A (examples of the adaptive sense voltage clamp circuits 106 and 108 in FIG. 1) in accordance with various examples. As shown, the comparator circuit 102A comprises an input transistor pair (MPN and MPP) and a current mirror transistor pair (MNN and MNP). The comparator circuit 102A also comprises cascoded transistors (MNNC, MPNC, MNPC, and MPPC) with current terminals in series between respective current terminals of the input transistor pairs and respective current terminals of the current mirror transistors. In the example of FIG. 2, MNNC and MPNC are cascoded transistors with current terminals in series with the second current terminal of MPN and the first current terminal of MNN. In the example of FIG. 2, the control terminals of MNNC and MNPC receive a bias voltage (VBNC). Also, MNPC and MPPC are cascoded transistors have current terminals in series with the second current terminal of MPN and the first current terminal of MNN. In the example of FIG. 2, the control terminal of MPNC receives a bias voltage (VBPC) and the control terminal of MPPC receives a clamped version of VSNS (from the INN node). Also, the second current terminal of MPN is coupled to the first current terminal of MPNC, the second current terminal of MPNC is coupled to the first current terminal of MNNC, and the second current terminal of MNNC is coupled to the first current terminal of MNN. Also, the second current terminal of MPP is coupled to the first current terminal of MPPC, the second current terminal of MPPC is coupled to the first current terminal of MNPC, and the second current terminal of MNPC is coupled to the first current terminal of MNP.

In the example of FIG. 2, the first current terminals of MPN and MPP are coupled to a common-mode node 214. As shown, the common-mode node 214 receives a bias current from a current source 208 between the VBIAS node 202 and the common-mode node 214. Also, the control terminal of MPN is coupled to a VREF node 204 to provide VREF (e.g., from the voltage supply circuit 110 in FIG. 1).

In the example of FIG. 2, the second current terminal of MPNC is coupled to the control terminals of MNN and MNP. The comparator circuit 102A also comprises an output node 210 that receives current from a current source 216. As shown, the output node 210 is coupled to a first current terminal of a transistor (M1). Meanwhile, the control terminal of M1 is coupled to a node (N2) between the first current terminal of MNPC and the second current terminal of MPPC. During operations of the comparator 102A, the output node 210 provides an output signal 116A indicating the comparison result of VREF and a clamped version of VSNS.

In the example of FIG. 2, the comparison result is potentially affected by clamping of VSNS, where clamping operations are performed by a low-level clamp circuit 108A and a high-level clamp circuit 106A. As shown, the low-level clamp circuit 108A is coupled to the VBIAS node 202, the VSNS node 206, the second current terminal of MN3, and a sense voltage path 216. Meanwhile, the high-level clamp circuit 106A is coupled to the common-mode node 214, the control terminals of MPP and MPPC, and the sense voltage path 216.

In some examples, VSNS is provided by a sensing resistor divider circuit 218. In the example of FIG. 2, the sensing resistor divider circuit 218 includes a first resistor (R1), a second resistor (R2), and a third resistor (R3) in series between a first sense voltage (VSNS1) and the ground node 212. The sensing resistor divider circuit 218 provides different sense voltage levels, including VSNS (between R1 and R2) and VSNS2 (between R2 and R3). In some examples, the comparator circuit 102A shares the sensing resistor divider circuit 218 with another circuit (not shown).

In operation, VSNS is limited or clamped by the high-level clamp circuit 106A and the low-level clamp circuit 108A. In some examples, VSNS is limited between VREF−2*VTN and VREF+2*VTP, where VREF is a reference voltage at the VREF node 204, VTN is the threshold voltage of an NMOS transistor (e.g., used with the high-level clamp circuits 106A and/or the low-level clamp circuit 108A), and VTP is the threshold voltage of a PMOS transistor (e.g., high-level clamp circuit 106A and the low-level clamp circuit 108A).

Figure 3:
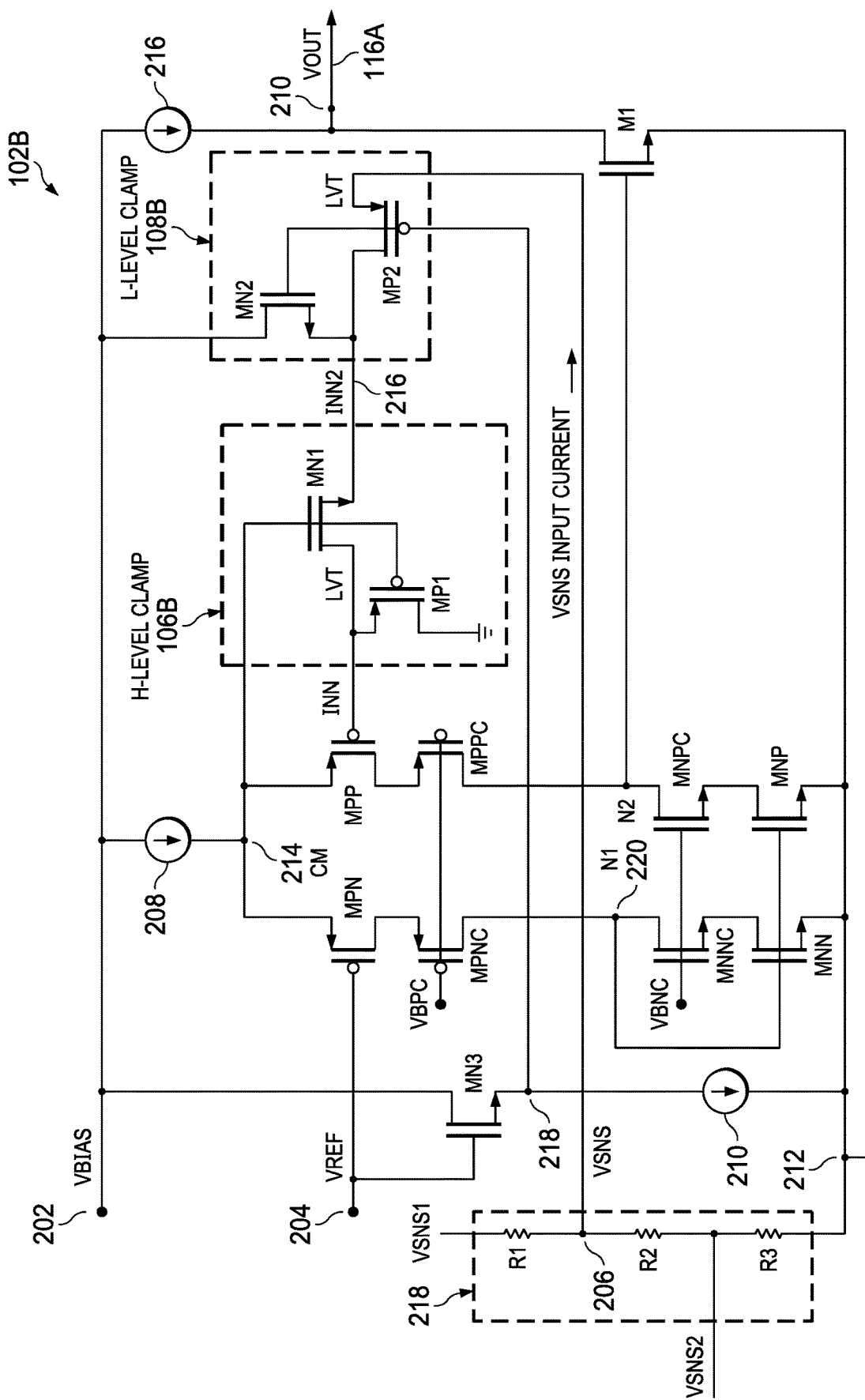
FIG. 3 is a schematic diagram showing a comparator circuit with adaptive sense voltage clamp details in accordance with various examples.

FIG. 3 is a schematic diagram showing a comparator circuit 102B (an example of the comparator circuit 102 in FIG. 1, or the comparator circuit 102A in FIG. 2) with adaptive sense voltage clamp details in accordance with various examples. In FIG. 3, the comparator circuit 102B includes many of the same components described for FIG. 2. In addition, the comparator circuit 102B includes example components high-level clamp circuit 106B (an example of the high-level clamp circuit 106 in FIG. 1, or the high-level clamp circuit 106A in FIG. 2) and example components for a low-level clamp circuit 108B (an example of the low-level clamp circuit 108 in FIG. 1, or the high-level clamp circuit 108A in FIG. 2).

In FIG. 3, the high-level clamp circuit 106B includes a first transistor, MN1, and a second transistor, MP1, where each of MN1 and MP1 have a control terminal, a first current terminal, and a second current terminal. As shown, the control terminals of MN1 and MP1 are coupled to the common-mode node 214, which serves as a high-level control node in the example of FIG. 3. The common-mode node 214 is configured to provide a common-mode voltage equal to the reference voltage (VREF) plus a transistor threshold voltage (e.g., from MPN in FIG. 3). More specifically, the second current terminal of the MN1 is coupled to a sense voltage input node of the comparator circuit (the control terminal of MPP). Also, the first current terminal of MN1 is coupled to a sense voltage path 216 that provides VSNS or a clamped version of VSNS if the low-level clamp circuit 108B is used. The first current terminal of MP1 is also coupled to the sense voltage input node of the comparator circuit (the control terminal of MPP), and the second current terminal of MP1 is coupled to a ground node. In some examples, MN1 is an NMOS transistor with a first threshold voltage, and MP1 is a PMOS transistor with a second threshold voltage that is greater than the first threshold voltage.

In FIG. 3, the low-level clamp circuit 108B includes a third transistor, MN2, and a fourth transistor, MP2, where each of MN2 and MP2 have a control terminal, a first current terminal, and a second current terminal. As shown, the control terminals of MN2 and MP2 are coupled to a low-level control node 218, where the low-level control node 218 is coupled to the VREF node 204 via a transistor gate-to-drain channel (the gate-to-drain channel of MN3 in FIG. 3). As shown in FIG. 3, the second current terminal of MN2 is coupled to the sense voltage path 216. Also, the first current terminal of MN2 is coupled to the VBIAS node 202. Also, the first current terminal of MP2 is coupled to the VSNS node 206 (e.g., coupled to the monitored component 112 of FIG. 1) to receive VSNS. Meanwhile, the second current terminal of MP2 is coupled to the second current terminal of MN2. In some examples, MN2 is an NMOS transistor with a first threshold voltage, and MP2 is a PMOS transistor with a second threshold voltage that is less than the first threshold voltage.

In some examples, the disclosed comparator circuit topologies include a PMOS input pair (e.g., MPP and MPN) and an NMOS current mirror load pair (e.g., MNP and MNN). Also, in some examples, the disclosed comparator circuit topologies include cascoded transistors (e.g., MPNC, MPPC, MNNC and MNPC). The reference node (N1) of the current mirror load is connected to a control node 220, which is coupled to the drain of MPNC. As shown, the control terminal of MPNC receives VREF.

In some examples, a high-level clamp circuit (e.g., the high-level clamp circuit 106B) for the disclosed comparator circuit topologies includes a low Vt NMOS transistor (e.g., MN1) and a normal Vt PMOS transistor (e.g., MP1). Meanwhile, a low-level clamp circuit (e.g., the low-level clamp circuit 108B) for the disclosed comparator circuit topologies includes a low Vt PMOS transistor (e.g., MP2) and a normal Vt NMOS transistor (e.g., MN2). As used herein, a low Vt is approximately 0.2V and a normal Vt is approximately 0.7V.

In some examples, a common-mode node (e.g., the common-mode node 214) for a comparator circuit is biased to VREF plus a threshold voltage (e.g., the Vt of MPN) regardless of VSNS voltage. In other words, CM=VREF+VTN, where VTN is the threshold voltage of a normal NMOS transistor. Also, in some examples, the control terminals of the low-level clamp circuit transistors (e.g., MN2 and MP2) are biased at VREF-VTN (e.g., MN3 generates VREF-VTN in FIG. 3).

In a first scenario where VSNS-VREF<-VTN+LVTP (Negative Value), the Vgs of MP2 is VREF-VTN-VSNS>-LVTP and MP2 will cut off. As used herein, VTN is the threshold voltage of a normal NMOS transistor, Vgs is a gate-to-source voltage, and LVTP is the threshold voltage of a low threshold voltage PMOS transistor. In the first scenario, the signal (labeled INN2 in FIG. 3) along the sense voltage path 216 could be high impedance but will be clamped at (VREF-VTN)-VTN=VREF-2*VTN by MN2. In such case, INN2=VREF-2*VTN. Also, the Vgs of MN1 is CM-INN2=(VREF+VTP)-(VREF-2*VTN)=VTP+2*VTN and MN1 will turn on. In such case, INN2 signal will go through MN1 and INN will be same voltage as INN2. In the above example, the delta between VREF and INN will be limited at -2*VTN (see e.g., region A 402 in FIG. 4).

In a second scenario where -VTN+LVTP (Negative value)<VSNS-VREF<VTP-LVTN (Positive Value), the Vgs of MP2 will be VREF-VTN-VSNS<-LVTP and MP2 will turn on. As used herein, VTP is the threshold voltage of a normal PMOS transistor, Vgs is a gate-to-source voltage, LVTN is the threshold voltage of a low threshold voltage NMOS transistor, and LVTP is the threshold voltage of a low threshold voltage PMOS transistor. In the second scenario, VSNS passes through MP2 and INN2 will be same as VSNS. Also, the Vgs of MN1 will be CM-VSNS=VREF+VTP-VSNS>LVTN and MN1 will turn on. Meanwhile, VSNS will pass through MN1 and the input voltage to MPP will be same voltage as VSNS. In such case, the comparator will operate in a normal mode (see e.g., region B 404 in FIG. 4).

In a third scenario, where VSNS-VREF>VTP-LVTN (positive Value), the Vgs of MP2 will be VREF-VTN-VSNS=-VTN-(VSNS-VREF)<-VTN-VTP+LVTN<-VTP and MP2 will turn on. In such case, MN1 will cut off because the Vgs of MN1 will be CM-VSNS<VREF+VTP-VSNS<LVTN. As used herein, VTP is the threshold voltage of a normal PMOS transistor, VTN is the threshold voltage of a normal NMOS transistor, Vgs is a gate-to-source voltage, LVTN is the threshold voltage of a low threshold voltage NMOS transistor, and LVTP is the threshold voltage of a low threshold voltage PMOS transistor. In the third scenario, INN could be high impedance but will be clamped by MP1 at CM+VTP=VREF+2*VTP. Accordingly, the delta between VREF and INN will be limited at +2*VTP (see e.g., region C 406 in FIG. 4).

Figure 4:
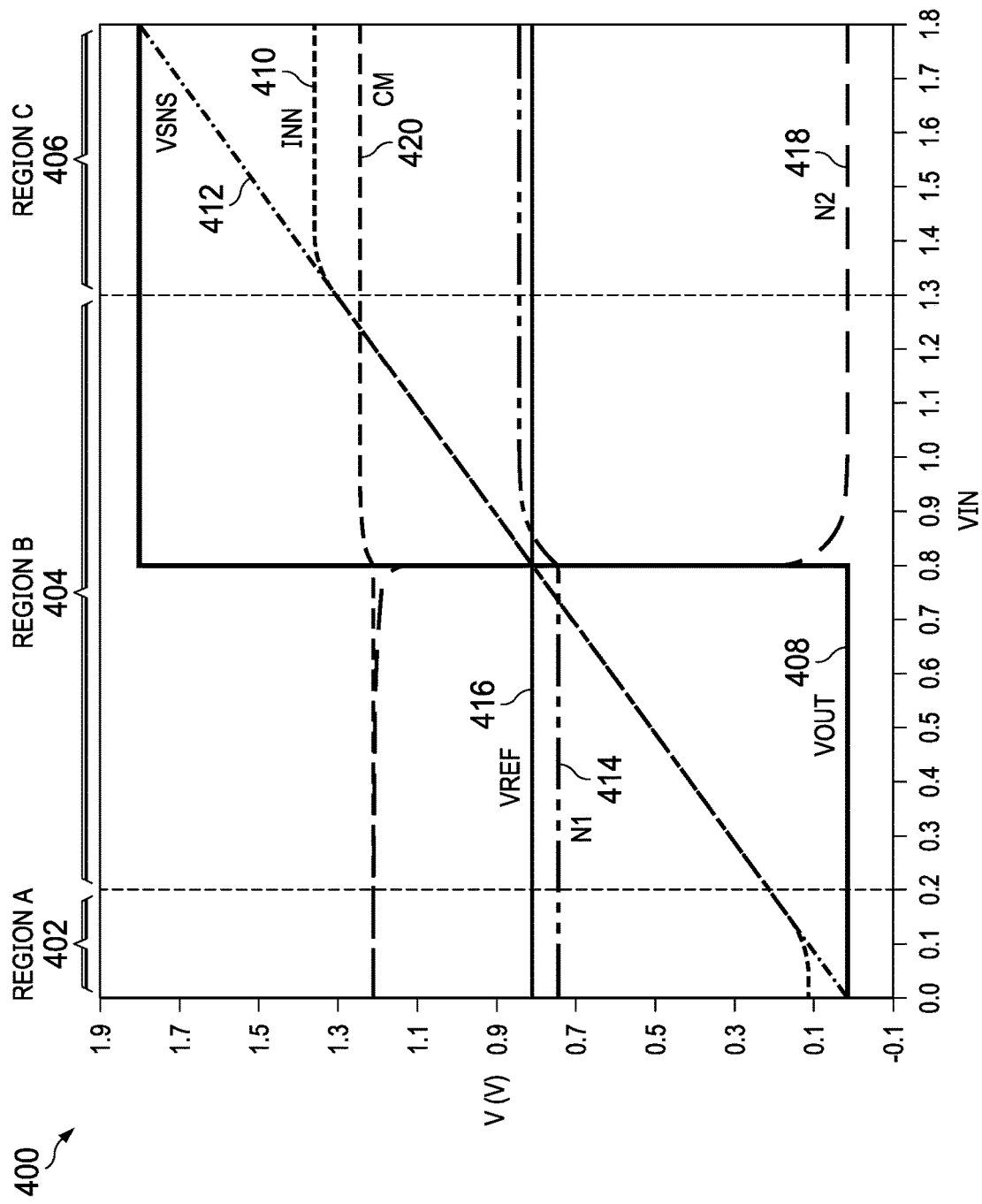
FIG. 4 is a graph showing comparator signals and adaptive sense voltage clamp signals in accordance with various examples.

FIG. 4 is a graph 400 showing comparator signals and adaptive sense voltage clamp signals in accordance with various examples. As shown, the graph shows representative VSNS signal 412, an INN signal 410, a VREF signal 416, a CM signal 420, an N2 signal 418 (see e.g., FIG. 3), and a VOUT signal 408 relative to three regions 402, 404, and 406. In graph 400, the three regions 402, 404, and 406 are labeled Region A 402, Region B 404, and Region C 406. In some examples, the signals and regions represented in graph 400 correspond to the disclosed comparator circuit topologies described herein (e.g., the comparator circuit 102 in FIG. 1, the comparator circuit 102A in FIG. 2, or the comparator circuit 102B in FIG. 3).

In the graph 400, region A 402 corresponds to a scenario where low-level clamping is performed such that INN 410 varies from VSNS 412 in region A 402. More specifically, in region A 402, INN 410 is clamped to a value that is higher than VSNS 412. In region B 404, INN 410 and VSNS 412 are the same (representing normal comparator operations). In region C 406, INN 410 is less than VSNS 412. More specifically, in region C 406, INN 410 is clamped to a value that is lower than VSNS 412.

In some examples, the disclosed comparator circuit topologies are used in an input power monitoring scenario. Table 1 shows example input monitoring scenarios with and without clamping.

TABLE 1

| Parameters | Without Clamping | With Clamping | Notes |
|---|---|---|---|
| VIN [V] | 18.3 | 18.3 | |
| VSNS [V] | 1.569 | 1.569 | |
| VREF [V] | 0.3 | 0.3 | |
| CM [V] | 0.75 | 0.75 | |
| VBTI stress voltage [V] | −0.450 | −0.450 | Vgs of MPN |
| NBTI Vt shift [V] | 100.0E−6 | 100.0E−6 | Estimated for 2000 hours at 150 C° |
| PBTI stress voltage [V] | 0.819 | 0.100 | Vgb of MPP, where Vgb is the gate-to-body voltage |
| PBTI Vt shift [V] | 6.0E−3 | 0.00 | Estimated for 2000 hours at 150 C° |
| Total Offset [V] | 5.9E−3 | −100E−6 | |

In the scenarios of Table 1, the input power supply is 18.3V, which is divided down to 1.569V and is connected to a VSNS node (e.g., node 206 in FIG. 3) of a comparator circuit (e.g., the comparator circuit 102B of FIG. 3). Also, VREF is biased as 0.3V, and CM will be at a higher voltage than VRF by VTP.

Also, if VTP is 0.45V for the example scenarios, then CM will be 0.75V. Without clamping, Vgs of MPN will be −0.45V and Vgs of MPP will be 0.819V. MPN will be exposed to NBTI stress and MPP will be exposed to PBTI stress. If Vt shift of MPN (e.g., due to the NBTI and PBTI) is 0.1 mV, MPP will be 6 mV. In this scenario, the total offset between the input pair will be 5.9 mV and this is almost 2% of VREF. With clamping, Vgs of MPN is same, but the Vgs of MPP will be clamped at 0.1V. In such case, Vt shift due to PBTI will be dramatically reduced to approximately 0.00 mV, and the total offset will be −0.1 mV (negligible relative to VREF voltage).

With the disclosed comparator circuit topologies, input current to a comparator circuit's input node is minimized using a compact solution. Also, in some examples, a sensing resistor divider (e.g., the sensing resistor divider 218) used by a comparator circuit can be shared with other circuitry. In different examples, the disclosed comparator circuit topologies (e.g., the comparator circuit 102 in FIG. 1, the comparator circuit 102A in FIG. 2, or the comparator circuit 102B in FIG. 3) may be applied to any product or scenario in which accurate voltage monitoring is achieved by mitigate NBTI and PBTI Vt shift risk as described herein.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a monitored component; and
a comparator configured to compare a sense voltage from the monitored component with a reference voltage; and
an adaptive input clamping circuit configured to limit the sense voltage input to the comparator to below an upper threshold voltage, the adaptive input clamping circuit including:
a high-level clamp circuit configured to limit the sense voltage input to the comparator to below the upper threshold voltage, the high-level clamp circuit having:
a first transistor; and
a second transistor, each of the first and second transistors having a control terminal, a first current terminal, and a second current terminal, and
wherein the control terminals of the first and second transistors are coupled to a high-level control node.

2. The system of claim 1, wherein the high-level control node is coupled to the common-mode node for the comparator, and wherein a common-mode node is configured to provide a common-mode voltage equal to the reference voltage plus a transistor threshold voltage.

3. The system of claim 1, wherein the second current terminal of the first transistor is coupled to a sense voltage input node of the comparator, wherein the first current terminal of the first transistor is coupled to a sense voltage path, wherein the first current terminal of the second transistor is coupled to the sense voltage input node of the comparator, and wherein the second current terminal of the second transistor is coupled to a ground node.

4. The system of claim 3, wherein the first transistor is an NMOS transistor with a first threshold voltage, and the second transistor is a PMOS transistor with a second threshold voltage that is greater than the first threshold voltage.

5. The system of claim 1, wherein the adaptive input clamping circuit further comprises:
a low-level clamp circuit configured to limit the sense voltage input to the comparator to above a lower threshold voltage, the low-level clamp circuit having:
a third transistor; and
a fourth transistor, each of the third and fourth transistors having a control terminal, a first current terminal, and a second current terminal, and
wherein the control terminals of the first and second transistors are coupled to a low-level control node.

6. The system of claim 5, wherein the low-level control node is coupled to the reference voltage via a transistor gate-to-source channel.

7. The system of claim 5, wherein the second current terminal of the third transistor is coupled to a sense voltage path, wherein the first current terminal of the third transistor is coupled to a voltage supply node, wherein the first current terminal of the fourth transistor is coupled to the monitored component to receive the sense voltage, and wherein the second current terminal of the third transistor is coupled to the first current terminal of the first transistor.

8. The system of claim 7, wherein the third transistor is an NMOS transistor with a first threshold voltage, and the fourth transistor is a PMOS transistor with a second threshold voltage that is less than the first threshold voltage.

9. A device, comprising:
a comparator circuit configured to compare a sense voltage with a reference voltage and to provide a comparison output, wherein the comparator circuit comprises:
an input transistor pair that includes a reference voltage input node and sense voltage input node;
a current mirror transistor pair; and
an adaptive clamping circuit configured to limit the sense voltage input to the sense voltage input node below an upper threshold voltage, wherein the adaptive clamping circuit including:
a high-level clamp circuit configured to limit the sense voltage provided to the sense voltage input node below an upper threshold voltage, the high-level clamp circuit having:
a first transistor; and
a second transistor, each of the first and second transistors having a control terminal, a first current terminal, and a second current terminal, and
wherein the control terminals of the first and second transistors are coupled to a high-level control node.

10. The comparator device of claim 9, wherein the high-level control node is coupled to a common-mode node for the comparator, and wherein a common-mode node is configured to provide a common-mode voltage equal to the reference voltage plus a transistor threshold voltage.

11. The comparator device of claim 10, wherein the second current terminal of the first transistor is coupled to the sense voltage input node, wherein the first current terminal of the first transistor is coupled to a sense voltage path, wherein the first current terminal of the second transistor is coupled to the sense voltage input node, and wherein the second current terminal of the second transistor is coupled to a ground node.

12. The comparator device of claim 11, wherein the adaptive clamping circuit further comprises:
   a low-level clamp circuit configured to limit the sense voltage provided to the sense voltage input node above a lower threshold voltage, the low-level clamp circuit having:
      a third transistor; and
      a fourth transistor, each of the third and fourth transistors having a control terminal, a first current terminal, and a second current terminal, and
         wherein the control terminals of the first and second transistors are coupled to a low-level control node.

13. The comparator device of claim 12, wherein the low-level control node is coupled to the reference voltage via a transistor gate-to-drain channel.

14. The comparator device of claim 12, wherein the second current terminal of the third transistor is coupled to a sense voltage path, wherein the first current terminal of the third transistor is coupled to a voltage supply node, wherein the second current terminal of the fourth transistor is coupled to a sense voltage receive node, and wherein the second current terminal of the fourth transistor is coupled to the first current terminal of the first transistor.

15. An integrated circuit, comprising:
   a comparator circuit having:
      an input transistor pair that includes a sense voltage input node;
      a current mirror transistor pair; and
      cascoded transistors with current terminals in series between respective current terminals of the input transistor pairs and respective current terminals of the current mirror transistors; and
   an adaptive clamp circuit for the comparator circuit, wherein the adaptive clamp circuit comprises:
      a first transistor and a second transistor, each of the first and second transistors having a control terminal, a first current terminal, and a second current terminal, wherein the control terminals of the first and second transistors are coupled to a common-mode voltage node for the comparator circuit.

16. The integrated circuit of claim 15, wherein the second current terminal of the first transistor is coupled to the sense voltage input node, wherein the first current terminal of the first transistor is coupled to a sense voltage path, wherein the first current terminal of the second transistor is coupled to the sense voltage input node, and wherein the second current terminal of the second transistor is coupled to a ground node.

17. The integrated circuit of claim 16, wherein the adaptive clamping circuit further comprises:
   a third transistor; and
   a fourth transistor, each of the third and fourth transistors having a control terminal, a first current terminal, and a second current terminal, and
      wherein the control terminals of the first and second transistors are coupled to a reference voltage node via a transistor gate-to-drain channel.

18. The integrated circuit of claim 17, wherein the second current terminal of the third transistor is coupled to the sense voltage path, wherein the first current terminal of the third transistor is coupled to a voltage supply node, wherein the first current terminal of the fourth transistor is coupled to a sense voltage receive node, and wherein the second current terminal of the fourth transistor is coupled to the first current terminal of the first transistor.

19. The integrated circuit of claim 18, wherein the first transistor is an NMOS transistor, second transistor is a PMOS transistor, wherein the third transistor is an NMOS transistor, and wherein the fourth transistor is a PMOS transistor.

* * * * *